United States Patent [19]

McGuffin

[11] 4,071,825
[45] Jan. 31, 1978

[54] ADAPTIVE DELTA MODULATION SYSTEM

[75] Inventor: William George McGuffin, Willingboro, N.J.

[73] Assignee: RCA Corporation, New York, N.Y.

[21] Appl. No.: 687,143

[22] Filed: May 17, 1976

[51] Int. Cl.² ............................................. H03K 13/22
[52] U.S. Cl. ................................. 325/38 B; 332/11 D
[58] Field of Search ................... 325/38 B; 332/11 D; 340/347 AD

[56] References Cited

U.S. PATENT DOCUMENTS

| 3,609,551 | 9/1971  | Brown    | 325/38 B |
| 3,699,566 | 10/1972 | Schindler | 325/38 B |
| 3,727,135 | 4/1973  | Holzer   | 178/68   |
| 3,857,111 | 12/1974 | Deschênes | 325/38 B |
| 3,922,606 | 11/1975 | Nordling | 325/38 B |
| 3,995,218 | 11/1976 | Moriya   | 325/38 B |

Primary Examiner—Robert L. Griffin
Assistant Examiner—Michael A. Masinick
Attorney, Agent, or Firm—H. Christoffersen; Samuel Cohen; Carl V. Olson

[57] ABSTRACT

A delta modulation system for generating a digital output signal representative of an analog input signal. The analog input signal is periodically compared to an analog feedback signal to generate the digital output signal. The analog feedback signal is generated from the digital output signal by generating a signal having an amplitude indicative of the absolute value of the derivative of the analog input signal, multiplying such absolute value signal by the digital output signal and integrating the product signal.

16 Claims, 3 Drawing Figures

ADAPTIVE DELTA MODULATION SYSTEM

BACKGROUND OF THE INVENTION

The present invention relates to digital transmission systems and more particularly, to delta modulation transmission systems.

BACKGROUND OF THE INVENTION

Delta modulators are widely used for encoding analog signals in digital form for transmission. In a delta modulator, the amplitude of the instantaneous analog input signal is periodically compared to an analog feedback signal, and a digital signal, representative of a logic one or a logic zero in accordance with the comparison, is generated. The analog feedback signal is typically generated by integrating the digital output signal. Thus, a delta modulator provides a digital output signal which is differentially indicative of the amplitude of the analog signal on a periodically sampled basis. In the receiver, an integration procedure identical to that used to generate the feedback signal is performed on the digital signal to generate thereby an analog signal representative of the analog input signal. For a more detailed description of delta modulating systems, reference is made to "Single Bit Delta Modulating Systems" by Lender et al., Electronics, Nov. 17, 1961, pp. 125-129.

Such relatively simple delta modulators, however, are operable only over a limited dynamic range of allowable input signal amplitudes before exceeding a predetermined maximum allowable amount of distortion. Amplitude quantization, inherent in integrating the digital signal, gives rise to amplitude deviations of the feedback signal, and the receiver analog output signal, from the analog input signal. Such deviations are referred to as quantizing noise and are typically controlled by employing a high sampling frequency or a small amplitude level digital signal or both. The difference between the respective amplitude levels representing logic zero and logic one in the signal applied to the integrator is referred to as the "quantum step size" of the modulator. A small quantum step size is desirable to maintain a satisfactory signal to noise ratio at low signal levels. A dilemma arises in that a large quantum step is required for the feedback signal to follow relatively abrupt changes in the analog input signal. In the event that the quantum step size is too small for the feedback signal to become equal or greater than the analog input signal by addition of a single quantum step, what is known in the art as "slope overload distortion" occurs.

To overcome the quantum step size dilemma, the prior art has developed a number of adaptive techniques whereby the quantum step size is varied in accordance with a predetermined parameter of the analog input signal. Generally, such adaptive techniques increase the quantum step size as a function of either the amplitude or the slope of the input signal.

Exemplary of systems using such prior art adaptive techniques are the delta modulation systems described in U.S. Pat. Nos. 3,646,442 issued Feb. 29, 1972 to R. Kotch; 3,746,990 issued July 17, 1973 to M. Le Diberder et al.; 3,806,806 issued Apr. 23, 1974 to S. Brolin; and 3,879,663 issued Apr. 22, 1975 to E. McGrogan, Jr. Other prior art adaptive systems are described in "High Information Delta Modulation," by Marion R. Winkler, IEEE International Convention Record 1963, Part 8, pp. 260-265; and "Deltamodulation for Cheap and Simple Telemetering," F. K. Bowers, 1959 IRE Wescon Convention Record, Part 5, pp. 63-67.

Such adaptive delta modulation systems are typically relatively complex. Moreover, the dynamic range of such systems is typically increased at the cost of increased quantization noise. For example, the above-mentioned Kotch and Le Diberder et al systems adjust the quantum step size in accordance with the absolute magnitude of the integrated digital signal. Such an "integrated digital signal" technique causes the quantum step size to be maximum at the maximum amplitudes of the input signal. The nature of the analog input signal in typical applications of delta-modulators is such that the slope is generally minimum at such amplitude maxima. The amplitude deviation of the feedback signal from the input signal and, accordingly, the quantizing noise level, are thus relatively high.

In other prior art systems, such as the above-mentioned Bowers, Winkler and Brolin systems, the quantum step size is adjusted in accordance with a high order function of the instantaneous slope of the analog input signal. Such "high order" systems have a tendency to overshoot, that is, to adjust the quantum step sizes to values for larger than required for the reproduction of many signals. While such "high order" systems generally have lower quantization noise levels and slope overload distortion over a predetermined dynamic range than do the above-described "integrated digital signal" systems over the same dynamic range, the overshoot tends to generate signal-related quantization distortion products, and further, the quantization noise level of such systems is typically still disadvantageously high.

In addition, various of the prior art adaptive delta modulators utilize complex analog circuitry, and, in particular, extensive precision operational amplifier circuits. Such systems require excessive precision components, or constant balancing adjustments, or both for stable operation. Due to the delicate balancing requirements, such delta modulators have been overly sensitive to component and power supply tolerances. Adaptive delta modulation systems avoiding the use of precision components are known, but the implementation thereof are relatively complex. For example, the above-mentioned McGrogan, Jr., system utilizes a "high order" type delta modulator avoiding the requirement of precision components and balancing. The feedback signal therein is produced by generating a pulse train having a duty cycle corresponding to the slope of the analog signal and integrating the duty cycle signal.

SUMMARY OF THE INVENTION

The present invention is directed to an adaptive delta modulation system with improved slope overload characteristics and a good signal to quantization noise ratio which can be implemented simply as compared to the prior art, and further does not require excessive precision components or delicate balancing. Specifically, the feedback signal to the comparator is developed by means, receptive of the digital signal, for generating an output signal having an amplitude approximately proportional to the absolute value of the derivative of the analog input signal. The derivative absolute value signal is multiplied by the digital signal, and the product is integrated to generate the feedback signal.

DETAILED DESCRIPTION OF A PREFERRED EMBODIMENT

Figure 1:
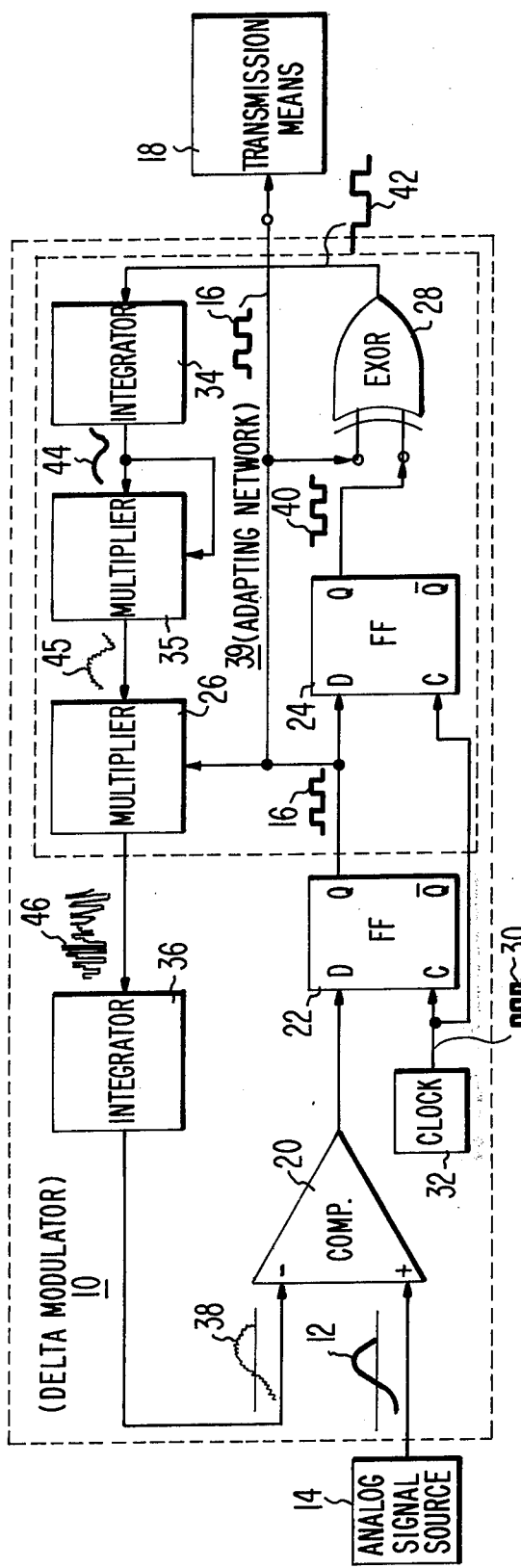
FIG. 1 is a block diagram of a delta modulator in accordance with the present invention.

Referring to FIG. 1, there is shown a delta modulator 10 in accordance with the present invention. Modulator 10 is receptive of an analog signal 12 from a suitable signal source 14 and generates a digital signal 16 representative of analog signal 12. Digital signal 16 is applied to a suitable transmission means 18. Analog signal source 14 and transmission means 18 are, for example, respectively, a microphone and a ratio transmitter.

More specifically, the structural organization of modulator 10 is as follows. Analog signal 12 is applied to the positive input of a conventional comparator 20, the output terminal of which is coupled to the D input terminal of a D-type flip flop (FF) 22. The Q output terminal of FF 22 is coupled to the D input terminal of a second D type FF 24, one input terminal of a conventional multiplier 26, one input terminal of a two input exclusive OR gate (EXOR) 28 and to transmission means 18. A clock signal 30 from a conventional clock oscillator 32 is applied to the respective clock inputs (C) of FF's 22 and 24. The Q output terminal of FF 24 is coupled to the second input terminal of EXOR 28. The output terminal of EXOR 28 is connected to the input terminal of a suitable integrator 34, the output terminal of which is coupled to both inputs of a second conventional multiplier 35. The output terminal of multiplier 35 is, in turn, coupled to the second input terminal of multiplier 26. The output terminal of multiplier 26 is coupled to a suitable integrator 36. Integrator 36 generates an output signal 38 which is applied as the feedback signal to the negative input terminal of comparator 20.

The operation of delta modulator 10 will now be described with reference to FIGS. 1 and 2. After a brief transient period, feedback signal 38 is a reconstruction of analog input signal 12, as will be explained. Comparator 20 compares analog input signal 12 to feedback signal 38, generating an output signal having logic value indicative of the polarity of the difference between the amplitudes of signals 12 and 38. FF 22 operates to sample the comparator output signal on a clocked basis. Accordingly FF 22 generates at its Q output terminal a differential monobit digital code signal 16 indicative of amplitude changes in analog signal 12. Digital signal 16 is transmitted by means 18.

In accordance with the present invention, FF 24, EXOR 28, integrator 34 and multipliers 26 and 35, comprise a quantum step size adapting network, generally indicated as 39. Adapting network 39 operates to adjust the quantum step size of the signal (46) applied to integrator 36 in accordance with a digitally derived approximation of the time derivative of analog input signal 12. FF 24 operates as a temporary storage means and generates a delayed code signal 40 identical to code signal 16 but delayed by one bit. EXOR 28, receptive of code signal 16 and delayed signal 40, thus compares consecutive pairs of bits in code 16 on a continuous basis. Consecutive ones of zeros occurring in code signal 16 are indicative of slope overload distortion and, moreover, the number of consecutive like-valued bits is indicative of the magnitude of the time-derivative (slope) of analog signal 12. EXOR 28 produces an output signal 42 which, when integrated by integrator 34, provides a unipolar voltage 44 proportional in amplitude to the number of consecutive like-value bits in signal 16. Thus, disregarding the effects of feedback signal 38, the output signal 44 of integrator 34 is proportional to the absolute value of the derivative of analog signal 12.

Modulator 10, however, normally operates in a closed loop condition, and the feedback signal 38 from adapting network 39 causes integrator (34) output signal 44 to move closely approximate the square root of the absolute value of the derivative of analog signal 12. Multiplier 35 produces an output signal 45 indicative of the square of the signal (44) applied to both the input terminals thereof. Accordingly, signal 45 closely approximates the absolute value of the derivative of analog signal 12 when feedback signal 38 is applied to comparator 20. Multiplier 26 operates to multiply digital signal 16 times derivative signal 45 to generate thereby an amplitude adjusted signal 46 having a quantum step size in accordance with the time derivative of analog input signal 12. Signal 46 is integrated by integrator 36 to generate feedback 38.

Figure 2:
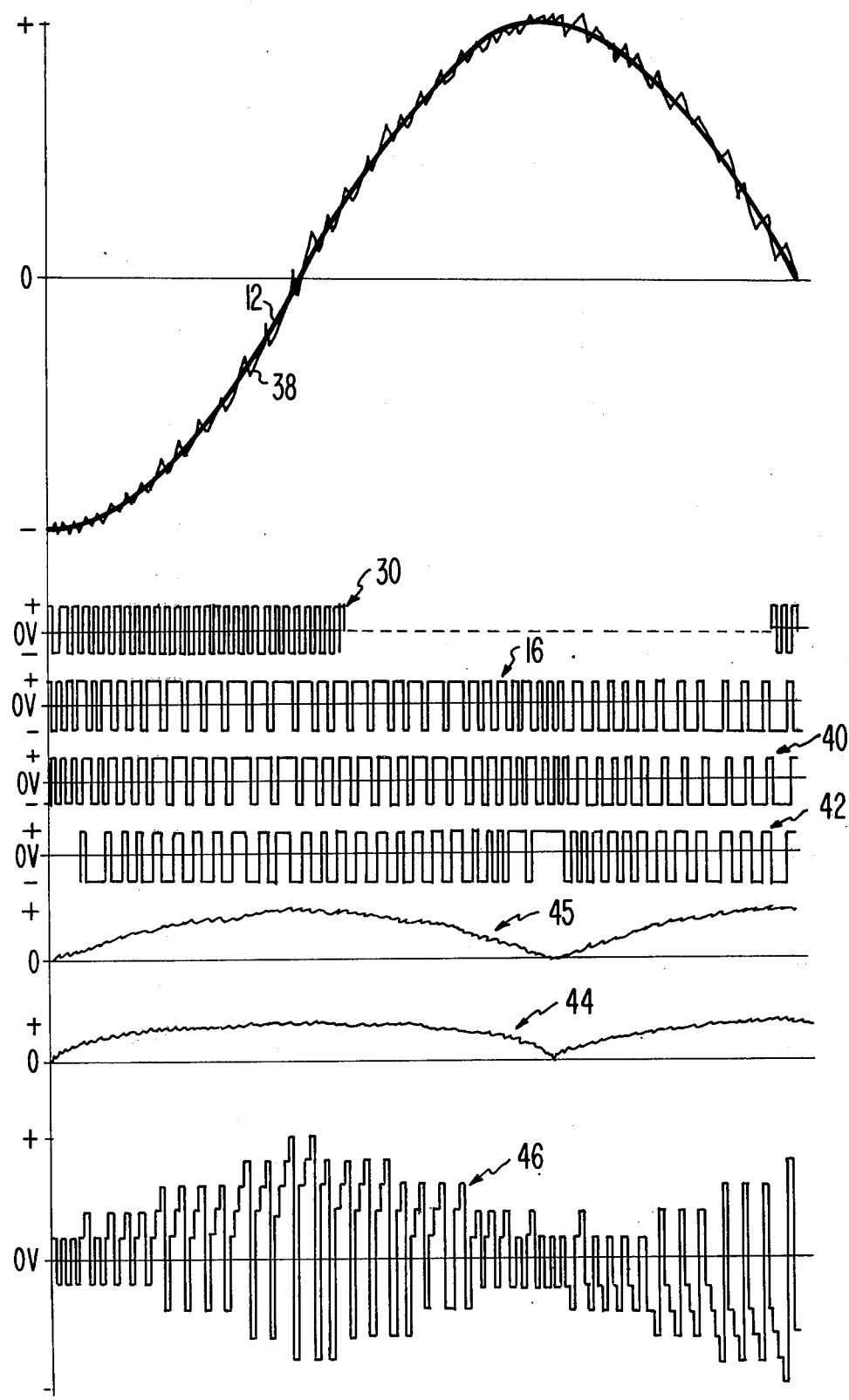
FIG. 2 is a diagram of the waveforms of various signals associated with the modulator of FIG. 1.

FIG. 2 shows, in timed relation, analog input signal 12, clock 30, digital code signal 16, delayed code signal 40, the output signal 42 of EXOR 28, signal 44 from integrator 34, signal 45 from multiplier 35, amplitude adjusted signal 46 and feedback signal 38. It should be noted that feedback signal 38 closely approximates analog input signal 12; in effect being equal to signal 12 but having superimposed thereon a granularity comprising low amplitude high frequency signal components generated during the quantizing process. The frequencies of such superimposed high frequency signal components are typically outside of the band of frequencies present in analog signal 12. It should be noted that the granularity of signal 38 decreases as the slope of signal 12 decreases and that even with the higher granularity of signal 38 in the high slope regions of signal 12 there are no gross deviations of signal 38 from signal 12 and a minimum of overshoot. It should be appreciated that the frequencies and relative amplitudes of the waveforms as depicted in FIG. 2 are chosen for ease of illustration. In practice, the frequency of clock signal 30 is typically in the order of 5 to 50 times the highest frequency contained in analog input signal 12.

Figure 3:
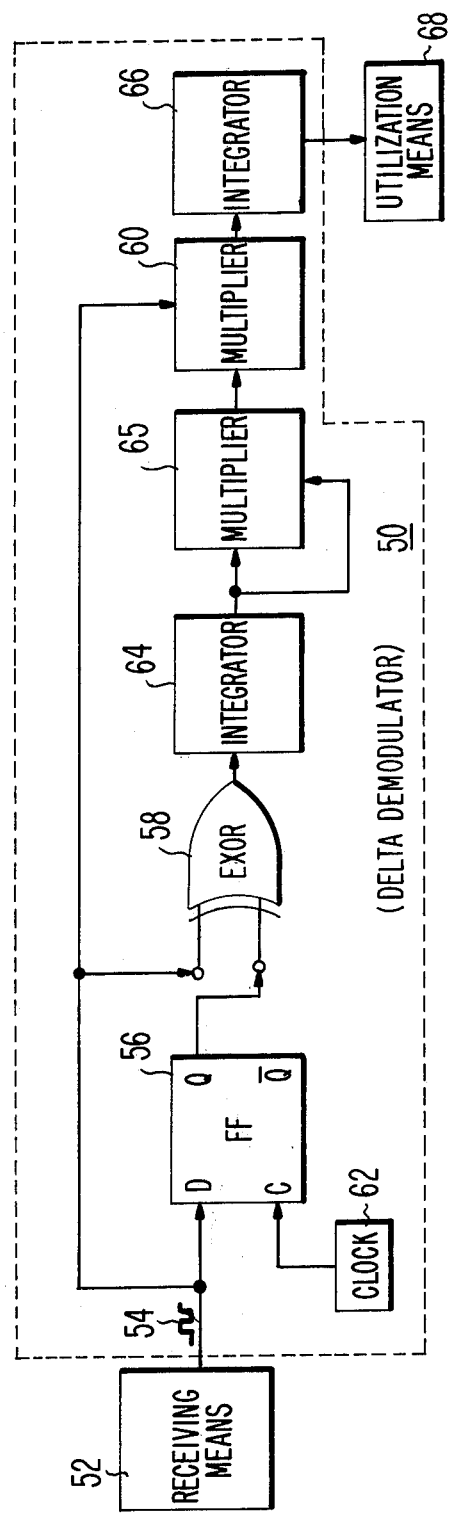
FIG. 3 is a block diagram of a delta demodulator in accordance with the present invention.

Digital code signal 16 is transmitted via means 18 to a remote delta modulator at which analog signal 12 is reconstructed from the transmitted digital signal. FIG. 3 shows according to the invention, a delta demodulator, generally indicated as 50. Suitable receiving means 52, for example a radio receiver, receives a signal 54, corresponding to code signal 16, from transmission means 18 and applies such signal to demodulator 50. Demodulator 50 is substantially identical to the combination of adapting network 39 and integrator 36 of FIG. 1. Specifically, the received digital signal 54 is applied to the D input terminal of a D type FF 56, one input terminal of a two-input EXOR 58 and one input of a multiplier 60. FF 56 is clocked by signals at the same rate as clock signal 30, generated by a clock 62. Clock 62 is synchronized to clock 30 by conventional phase locked loop techniques (not shown) operating on a received signal 54. FF 56 supplies a delayed code signal to the second input terminal of EXOR 58, the output signal of which is applied to integrator 64. The output signals of integrator 64 are applied to both inputs of multiplier 65 the output signals of which are applied to the remaining input of multiplier 60. Multiplier 60 is, in turn, coupled to an integrator 66. FF 56, EXOR 58, integrators 64 and 66, and multipliers 60 and 65 are respectively substantially identical to FF 24, EXOR 28 integrators 34 and 36, and multipliers 26 and 35 of modulator 10. FF 56, EXOR 58, integrator 64 and multipliers 60 and 65 operate in an identical manner to the corresponding components of adaptive network 39 to provide an amplitude-adjusted digital signal having a quantum step size in accordance with the time derivative of analog signal 12. Integrator 66 integrates the multiplier output signal to reconstruct, in effect, analog signal 12 (FIG. 1), i.e., to generate an analog output signal substantially identical to feedback signal 38. The reconstructed analog signal is applied to suitable utilization means 68 such as an amplifier or a speaker. Such utilization means usually incorporates a low pass filter, (not shown) to remove the high frequency, out-of-band, components of the reconstructed analog signal, to approximate more closely input signal 12.

A delta modulator 10 and delta demodulator 50, in accordance with the present invention, have been constructed utilizing RCA complementary symmetry metal oxide semiconductor (COS/MOS) digital integrated circuit CD4013 for flip-flops 22, 24 and 56, and CD 4030 for exclusive-or gate 28 and 58; RCA linear integrated circuit operational transconductance amplifiers (OTA) CA3080 for multiplier circuits 26, 35, 60 and 65; and RCA high gain-bandwidth product operational amplifier CA31005 for comparator 20. Two complete systems have been built and evaluated: One suitable for processing wide band hi-fidelity analog inputs such as music; and one suitable for processing relatively narrow band analog inputs such as voice.

The wide band (music) system was designed to process an input frequency spectrum from 50 Hz to 15,000 Hz with an input amplitude dynamic range of approximately 60 db. Provisions were made to adjust the clock frequency to provide a range of bit rates from 50 kilobits/second to 800 kilobits/second. Subjective testing revealed that a bit rate of approximately 200 kilobits/second was required to satisfy most of the subjects tested.

The narrow band (voice or telephone) system was designed to process an input frequency spectrum from 100 Hz to 3,400 Hz with amplitude variations in excess of 40 db. The clock frequency was adjusted to provide bit rates from 10 kilobits/second to over 200 kilobits/second. Subjective testing revealed that voice quality was extremely good at bit rates as low as 40 kilobits/second, was acceptable to bit rates as low as 20 kilobits/second, and was marginal for any lower bit rates. Intelligibility of the voice signals, however, was found completely adequate at 10 kilobits/second.

It should be appreciated that utilizing a feedback signal digitally derived in accordance with the derivative of analog input signal 12 provides an optimization of wide dynamic range, slope overload distortion and quantization noise. In some applications, however, for example in military communication systems, high fidelity reproduction is of secondary importance in relation to a principle purpose of maintaining low quantization noise. It was found that by omitting multiplier 35 in modulator 10 and multiplier 65 in demodulator 50, and connecting the respective integrators 34 and 64 directly to multipliers 26 and 60, a lower level of quantization noise can be achieved but at the expense of reduced dynamic range. As noted above, the output signals of integrators 34 and 64 are indicative of the absolute value of the derivative of analog signal 12, in that they are approximately proportional to the square root of such derivative.

What is claimed is:

1. In a system of the type including a modulator and demodulator for communicating an analog input signal as a sequence of digital bits, the modulator comprising first means for generating a signal indicative of the difference between said analog input signal and a feedback signal: second means, responsive to said signal from said first means for generating a digital output signal at a predetermined bit rate, said digital output signal being indicative of the polarity of the signal from said first means during the time of occurrence of respective digital bits, said digital output signal being communicated to said demodulator: third means, responsive to said digital output signal, for generating an amplitude varied output signal indicative of said digital output signal, but having amplitude levels in accordance with a time derivative of said analog input signal: fourth means, responsive to said amplitude varied signal, for generating an analog signal indicative of said amplitude varied signal, said signal from said fourth means being applied as said feedback signal to said first means;

the improvement wherein said third means comprises:

fifth means, responsive to said digital output signal, for generating a signal indicative of the absolute value of the derivative of said analog input signal; and sixth means, responsive to the output of said fifth means and said digital signal, for generating a signal having an amplitude representative of the product of said digital output signal and the signal from said fifth means, said signal from said sixth means being applied to said fourth means.

2. The system of claim 1, wherein said fifth means comprises:

seventh means for generating an output signal indicative of the occurrence of consecutive bits of equal value in said digital signal;

eighth means, receptive of said seventh means output signal, for generating an output signal indicative of the integral of said seventh means output signal.

3. The system of claim 2 wherein said fifth means further includes:

ninth means, responsive to said eighth means output signal for generating an output signal indicative of the square of said eighth means output signal.

4. The system of claim 2 wherein said seventh means comprises:

10th means, receptive of said digital signal, for generating an output signal equal to said digital signal, but delayed by one bit; and 11th means, responsive to said digital signal and said delayed signal, for generating an output signal having a high level amplitude only when the values of said digital signal and said delayed signal are equal.

5. The system of claim 1, wherein said demodulator comprises:

12th means, responsive to said digital signal, for generating an output signal substantially equivalent to said modulator feedback signal.

6. The system of claim 5 wherein said twelfth means comprises:
- 13th means, responsive to said digital signal, for generating a signal indicative of the absolute value of the derivative of said analog input signal to said modulator; and
- 14th means, responsive to said signal from said thirteenth means and said digital signal, for generating an output signal having an amplitude representative of the product of said digital signal and the signal from said thirteenth means; said output signal from said fourteenth means being substantially equivalent to said feedback signal.

7. Apparatus for generating a digital signal indicative of an analog input signal comprising:
- first means, responsive to said analog input signal and a feedback signal applied thereto, for generating a signal indicative of the difference in amplitude between said analog input signal and said feedback signal,
- second means, responsive to the output of said first means, for generating a digital output signal at a predetermined bit rate, said digital output signal being indicative of the polarity of the output of said first means during the respective bits;
- third means, responsive to said digital output signal, for generating a signal having an amplitude indicative of the absolute value of the derivative of said analog input signal;
- fourth means, responsive to the output of said third means and said digital output signal, for generating a signal having an amplitude representative of the product of the amplitudes of said digital output signal and the output of said third means; and
- fifth means, responsive to the output of said fourth means, for generating an analog signal indicative of the output of said fourth means, the output of said fifth means being applied as said feedback signal to said first means.

8. The apparatus of claim 7, wherein said third means comprises:
- sixth means, responsive to said digital signal, for generating an output signal indicative of the occurrence of consecutive bits of equal value in said digital signal; and
- seventh means, responsive to said sixth means output signal, for generating an output signal indicative of the integral of said sixth means output signal.

9. The apparatus of claim 8, wherein said seventh means further includes:
- eighth means, responsive to said seventh means output signal, for generating an output signal indicative of the square of said seventh means output signal.

10. The apparatus of claim 8, wherein said sixth means comprises:
- eighth means, responsive to said digital signal, for generating an output signal equal to said digital signal, but delayed by one bit; and
- ninth means, responsive to said digital signal and said delayed signal, for generating an output signal having a high level amplitude only when the value of said digital signal and said delayed signal are equal.

11. Apparatus for generating an analog signal from a digital data modulated signal comprising:
- first means for receiving said digital signal;
- second means, responsive to said digital signal, for generating an output signal indicative of the absolute value of the derivative of said analog signal to be generated;
- third means, responsive to said second means output signal and said digital signal, for generating an output signal having an amplitude representative of the product of said digital signal and second means output signal; and
- fourth means, responsive to said third means output signal, for generating an analog output signal indicative of said third means signal, said fourth means output signal being said analog output signal.

12. The apparatus of claim 11, wherein said second means comprises:
- fifth means, responsive to said digital signal, for generating an output signal indicative of the occurrence of consecutive bits of equal value in said digital signal;
- sixth means, responsive to said fifth means output signal, for generating an output signal indicative of the integral of said fifth means output signal.

13. The system of claim 12, wherein said second means further includes:
- seventh means, responsive to said sixth means output signal, for generating an output signal indicative of the square of said sixth means output signal.

14. The system of claim 12 wherein said fifth means comprises:
- eighth means, responsive to said digital signal, for generating an output signal equal to said digital signal, but delayed by one bit; and
- ninth means, responsive to said digital signal and said delayed signal, for generating an output signal having a high level amplitude only when the values of said digital signal and said delayed signal are equal.

15. A method of generating a digital output signal indicative of an analog input signal comprising the steps of
- a. generating, from said analog input signal and a feedback signal, a difference signal indicative of a difference in amplitude between said analog input signal and said feedback signal,
- b. generating, from said difference signal a digital output signal having a predetermined bit rate, said digital output signal being indicative of the polarity of said difference signal during the respective bits;
- c. generating, from said digital output signal, an absolute value signal having an amplitude indicative of the absolute value of the derivative of said analog input signal;
- d. generating, from said absolute value signal and said digital signal, a product signal having an amplitude representative of the product of the amplitudes of said digital signal and absolute value signal; and
- e. generating, from said product signal, an analog feedback signal indicative of said product signal, said analog feedback signal being utilized as said feedback signal in the above difference signal step (a).

16. A method of generating an analog output signal from a digital data modulated signal comprising:
- a. receiving said digital signal;
- b. generating, from said digital signal, a signal indicative of the absolute value of the derivative of said analog input signal;
- c. generating, from said absolute value signal and said digital signal, a signal having an amplitude representative of the product of said digital signal and said absolute value signal; and
- d. generating, from said product signal, an analog signal indicative of said product signal, said analog signal being said analog output signal.

* * * * *